United States Patent
Maulik et al.

(10) Patent No.: US 9,602,119 B1
(45) Date of Patent: Mar. 21, 2017

(54) GAIN CALIBRATION BY APPLYING A PORTION OF AN INPUT VOLTAGE TO VOLTAGE ASSOCIATED WITH A CAPACITOR ARRAY

(71) Applicant: APPLIED MICRO CIRCUITS CORPORATION, Santa Clara, CA (US)

(72) Inventors: Prabir Maulik, Santa Clara, CA (US); Nanda Govind, Santa Clara, CA (US)

(73) Assignee: APPLIED MICRO CIRCUITS CORPORATION, Santa Clara, CA (US)

(*) Notice: Subject to any disclaimer, the term of this patent is extended or adjusted under 35 U.S.C. 154(b) by 0 days.

(21) Appl. No.: 15/018,984

(22) Filed: Feb. 9, 2016

(51) Int. Cl.
*H03M 1/06* (2006.01)
*H03M 1/10* (2006.01)
*H03M 1/38* (2006.01)
*H03M 1/80* (2006.01)

(52) U.S. Cl.
CPC ........... *H03M 1/1009* (2013.01); *H03M 1/38* (2013.01); *H03M 1/804* (2013.01)

(58) Field of Classification Search
CPC ..... H03M 1/38; H03M 1/1009; H03M 1/1023
USPC ................... 341/118, 120, 163, 172
See application file for complete search history.

(56) References Cited

U.S. PATENT DOCUMENTS

| | | | | |
|---|---|---|---|---|
| 4,399,426 A | * | 8/1983 | Tan | H03M 1/183 341/120 |
| 5,825,316 A | * | 10/1998 | Kuttner | H03M 1/1052 341/120 |
| 7,609,184 B2 | * | 10/2009 | Kuramochi | H03M 1/1047 341/118 |
| 7,710,303 B2 | | 5/2010 | Wojewoda et al. | |
| 7,853,229 B2 | | 12/2010 | Maulik et al. | |
| 8,378,863 B2 | * | 2/2013 | Ishikawa | H03M 1/00 341/118 |
| 8,497,790 B1 | | 7/2013 | Lewis et al. | |
| 8,587,460 B2 | | 11/2013 | Noguchi et al. | |
| 8,638,248 B2 | * | 1/2014 | Wu | H03M 1/1047 341/118 |
| 9,088,293 B1 | | 7/2015 | D'Souza et al. | |
| 9,106,249 B1 | | 8/2015 | Dyer et al. | |

* cited by examiner

*Primary Examiner* — Khai M Nguyen
(74) *Attorney, Agent, or Firm* — Amin, Turocy & Watson LLP

(57) ABSTRACT

Various aspects facilitate gain adjustment associated with an analog to digital converter. A capacitor array comprises a plurality binary-weighted capacitors and generates an output voltage received by a comparator based on an input voltage and a reference voltage. A gain calibration component receives the input voltage and applies a modified input voltage that corresponds to a portion of the input voltage to the output voltage generated by the capacitor array component.

20 Claims, 8 Drawing Sheets

GAIN CALIBRATION BY APPLYING A PORTION OF AN INPUT VOLTAGE TO VOLTAGE ASSOCIATED WITH A CAPACITOR ARRAY

TECHNICAL FIELD

The subject disclosure relates generally to analog to digital converters, and more particularly to gain adjustment associated with an analog to digital converter.

BACKGROUND

A successive approximation register (SAR) analog to digital converter (ADC) is often employed in electronic systems to convert an analog signal into a digital representation of the analog signal via a charge scaling circuit that performs a binary search algorithm. The charge scaling circuit generally includes an array of capacitors that is employed to perform the binary search algorithm. However, gain error is often associated with an SAR ADC (e.g., as a result of the binary search algorithm performed by the charge scaling circuit). To compensate for the gain error, a gain calibration process can be employed in connection with the SAR ADC. The gain calibration process is generally performed in the digital domain. For example, a conventional gain adjustment process generally involves a digital multiplier. However, employing a digital multiplier for gain calibration often consumes a large amount of power. Moreover, performing a gain calibration process in the digital domain often results in an increased number of bits for the digital representation of the analog signal, quantization noise and/or decreased performance of the SAR ADC.

The above-described description is merely intended to provide a contextual overview of current SAR ADC systems and is not intended to be exhaustive.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

In an example embodiment, a system comprises a capacitor array and a gain calibration component. The capacitor array component comprises a plurality binary-weighted capacitors. Furthermore, the capacitor array component is configured for generating an output voltage received by a comparator based on an input voltage and a reference voltage. The gain calibration component is configured for receiving the input voltage and applying a modified input voltage that corresponds to a portion of the input voltage to the output voltage generated by the capacitor array component.

In another example embodiment, a method comprises providing an input voltage to a first plurality of capacitors configured for generating an output voltage based on the input voltage and a reference voltage, providing the input voltage to a second plurality of capacitors configured for generating a modified input voltage based on the input voltage, applying the modified input voltage to the output voltage to generate a gain adjusted output voltage, and converting the gain adjusted output voltage into a digital output.

In yet another example embodiment, a method comprises receiving an input voltage via a charge scaling circuit of an analog to digital converter (ADC), receiving and input voltage, in parallel to the charge scaling circuit, via a gain calibration circuit of the ADC, sampling the input voltage via a plurality of capacitors of the charge scaling circuit using top-plate sampling, and sampling the input voltage via a different plurality of capacitors of the gain calibration circuit using bottom-plate sampling.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

DETAILED DESCRIPTION

Figure 1:
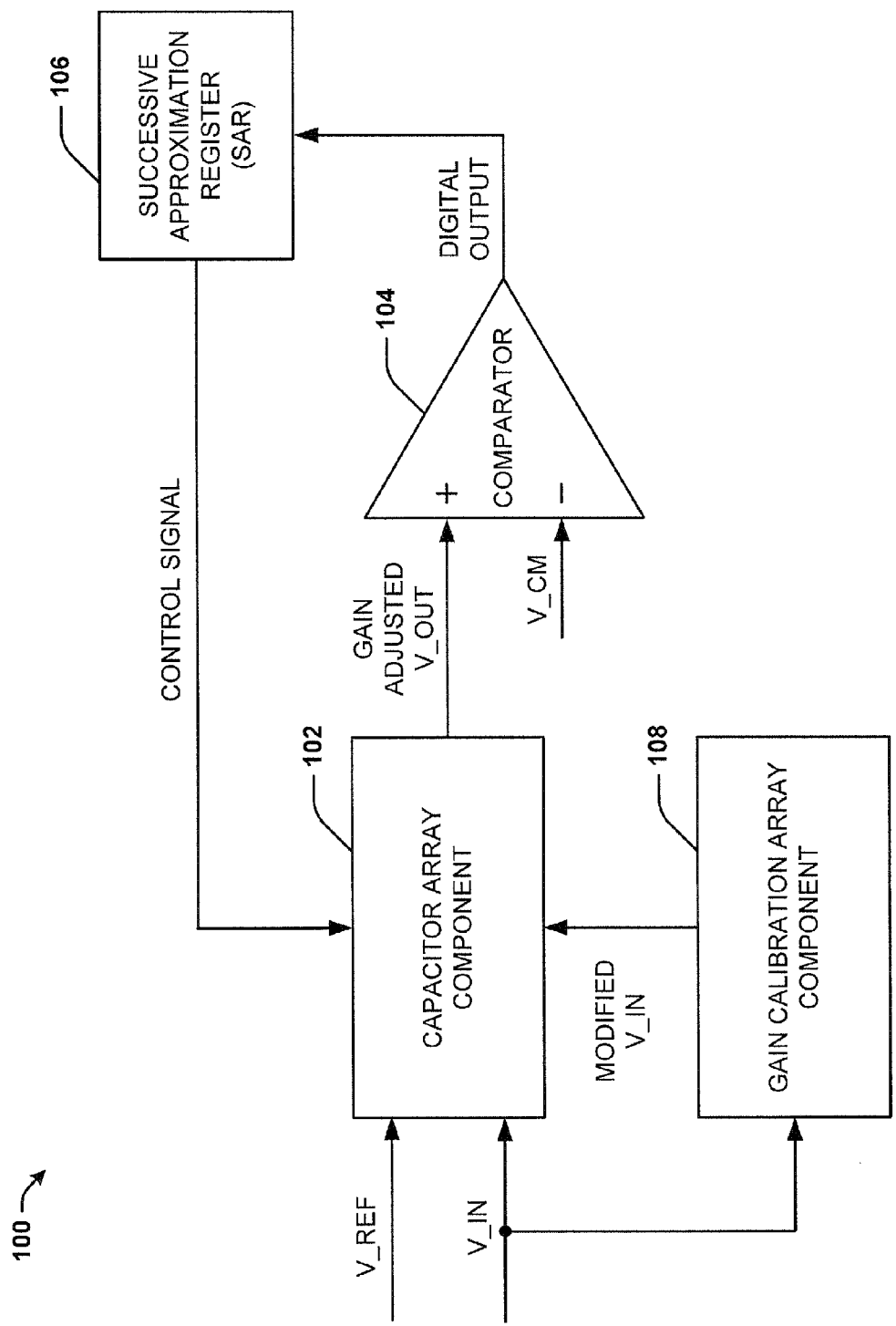
FIG. 1 is a block diagram illustrating an example, non-limiting embodiment of a system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

Various aspects of the present disclosure provide for gain calibration associated with an analog to digital converter (ADC). For example, gain adjustment associated with an ADC can be performed using an analog circuit. The analog circuit can include a switched capacitor array configured to adjust gain associated with the ADC (e.g., adjust gain associated with a main capacitor array of the ADC). For example, the analog circuit can be an auxiliary capacitor array in the ADC that is separate from a main capacitor array in the ADC. In an aspect, the analog circuit can be configured to generate an analog signal that corresponds to a certain percentage of an input analog signal received by the main capacitor array and the analog circuit. The analog circuit can therefore transmit the analog signal (e.g., the analog signal that corresponds to the certain percentage of the input analog signal) to the main capacitor array to compensate for gain error associated with the main capacitor array. In one example, the gain calibration can be performed for a successive approximation register (SAR) ADC.

Turning now to FIG. 1, a block diagram illustrating an example, non-limiting embodiment of a system 100 in accordance with various aspects described herein is shown. System 100 includes a capacitor array component 102, a comparator 104, a SAR 106 and/or a gain calibration array component 108. In an aspect, the capacitor array component 102, the comparator 104 and/or the SAR 106 can correspond to a SAR ADC. In one implementation, the system 100 can be implemented in connection with an ADC-based receiver (e.g., an ADC-based optical receiver, an ADC-based fiber optic receiver, etc.). For example, the system 100 can be associated with a 16 nm 66Gs/s ADC for an optical receiver. In another implementation, the system 100 can be implemented in connection with a complementary metal-oxide semiconductor (CMOS) system. The system 100 can be employed by various systems, such as, but not limited to microcontroller systems, data acquisition systems, data communication systems, telecommunication systems, other electronic systems, etc. Moreover, the system 100 can be employed to facilitate analog gain adjustment of an ADC (e.g., to improve gain adjustment associated with an ADC).

The capacitor array component 102 can be a digital to analog converter (DAC) sampling capacitor array. The capacitor array component 102 can receive an input voltage (e.g., V_IN shown in FIG. 1). The input voltage can be an analog input voltage. In one example, the input voltage can be an SAR ADC input voltage. The capacitor array component 102 can also receive a reference voltage (e.g., V_REF shown in FIG. 1). The reference voltage can be an analog reference voltage. The capacitor array component 102 can be implemented as a capacitor array circuit (e.g., a main capacitor array circuit) for an ADC. In one example, the capacitor array component 102 can be a charge scaling circuit (e.g., a charge redistribution circuit) for an ADC. The capacitor array component 102 can be configured to perform a binary search algorithm for converting the input voltage (e.g., V_IN) into a digital representation of the input voltage. The capacitor array component 102 can include a plurality of capacitors (e.g., a plurality of DAC sampling capacitors, a plurality of binary-weighted capacitors, a plurality of switched capacitors, a plurality of thermometric weighted capacitors, etc.). For example, the plurality of capacitors of the capacitor array component 102 can be configured as an array of binary-weighted capacitors (or an array of thermometric weighted capacitors) that are each individually switched (e.g., a node of each capacitor in the plurality of capacitors can be switched between the reference voltage and ground) based on a control signal (e.g., CONTROL SIGNAL shown in FIG. 1) generated by the SAR 106. In an implementation, control signal generated by the SAR 106 can be received by the capacitor array component 102 and the gain calibration array component 108.

The gain calibration array component 108 can additionally receive the input voltage (e.g., V_IN) in parallel with the capacitor array component 102. The gain calibration array component 108 can be implemented as a gain calibration circuit for an ADC. For example, the gain calibration array component 108 can be employed to adjust gain associated with the capacitor array component 102 (e.g., to compensate for gain error associated with the capacitor array component 102). In one example, the capacitor array component 102 can be a main capacitor array and the gain calibration array component 108 can be an auxiliary capacitor array. The gain calibration array component 108 can generate a modified input voltage (e.g., MODIFIED V_IN shown in FIG. 1) based on the input voltage. The modified input voltage can correspond to a portion of the input voltage. For example, the modified input voltage can be a certain percentage of the input voltage. Therefore, a certain percentage of the input voltage can be additionally injected into the capacitor array component 102 via the modified input voltage.

The modified input voltage can be employed by the capacitor array component 102 to adjust gain (e.g., to compensate for gain error, to calibrate gain, etc.) associated with an output voltage (e.g., an analog output voltage) generated by the capacitor array component 102. For example, an output voltage (e.g., an analog output voltage) can be generated by the plurality of capacitors of the capacitor array component 102 based on the input voltage and the reference voltage. Furthermore, the modified input voltage can be applied to the output voltage (e.g., the analog output voltage) generated by the plurality of capacitors to generate a gain adjusted output voltage (e.g., GAIN ADJUSTED V_OUT shown in FIG. 1). Therefore, the capacitor array component 102 can generate the gain adjusted output voltage based on the input voltage, the reference voltage, the modified input voltage and/or the control signal. The gain adjusted output voltage can be an analog gain adjusted output voltage.

In an aspect, the comparator 104 can receive the gain adjusted output voltage. Based on the gain adjusted output voltage and a common mode voltage (e.g., V_CM shown in FIG. 1), the comparator 104 can generate digital output (e.g., DIGITAL OUTPUT shown in FIG. 1). The digital output generated by the comparator 104 can be a digital representation of the input voltage (e.g., V_IN). In another aspect, the SAR 106 can receive the digital output generated by the comparator 104.

Accordingly, the system 100 can accomplish gain adjustment via analog circuitry (e.g., the gain calibration array component 108), and therefore digital gain calibration can be avoided. As a result, size of the digital output (e.g., the digital output generated by the comparator 104) can be minimized and/or maintained without introducing quantization error and/or quantization noise. Moreover, gain adjustment can be realized without modifying the reference voltage (e.g., the reference voltage associated with an ADC). Therefore, the reference voltage can be shared across multiple ADCs. Furthermore, gain adjustment can be realized without employing a digital multiplier and/or power consumption for accomplishing gain adjustment can be reduced.

Figure 2:
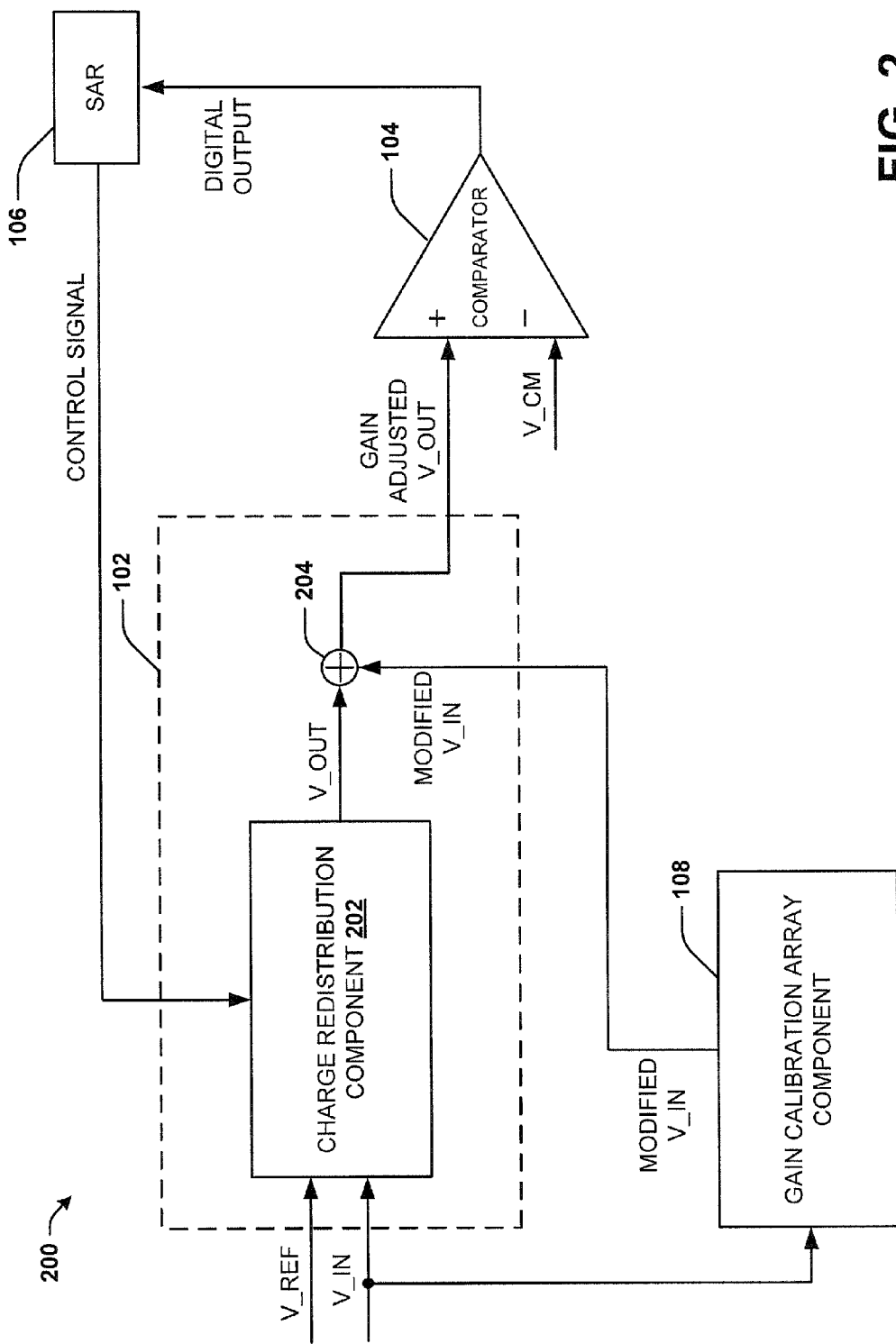
FIG. 2 is a block diagram illustrating an example, non-limiting embodiment of a capacitor array component in accordance with various aspects described herein.

Referring now to FIG. 2, a block diagram illustrating an example, non-limiting embodiment of a system 200 in accordance with various aspects described herein is shown. System 200 includes the capacitor array component 102, the comparator 104, the SAR 106 and/or the gain calibration array component 108. The capacitor array component 102 includes at least a charge redistribution component 202 and an adder 204. The capacitor array component 102 can be, for example, a DAC sampling capacitor array.

The charge redistribution component 202 can include a plurality of capacitors and/or a set of switches associated with the plurality of capacitors. The charge redistribution component 202 can generate an output voltage (e.g., V_OUT shown in FIG. 2) based on the input voltage (e.g., V_IN), the reference voltage (e.g., V_REF) and/or the control signal (e.g., CONTROL SIGNAL). In an aspect, the charge redistribution component 202 can implement a binary search algorithm. In one example, the charge redistribution component 202 can be a charge scaling circuit. The output voltage and the modified input voltage (e.g., MODIFIED V_IN) can be received by the adder 204. For example, the adder 204 can apply the modified input voltage to the output voltage to generate the gain adjusted output voltage (e.g., the GAIN ADJUSTED V_OUT). Therefore, the gain adjusted output voltage can be an output voltage that is generated by the capacitor array component 102 in conjunction with the gain calibration array component 108. The adder 204 can be an analog adder. For example, the adder 204 can generate an analog signal (e.g., the gain adjusted output voltage) based on a first analog signal (e.g., the output voltage) and a second analog signal (e.g., the modified input voltage). Accordingly, gain calibration can occur after the charge redistribution component 202 but before the comparator 104 generates the digital output (e.g., the digital representation of the input voltage).

Figure 3:
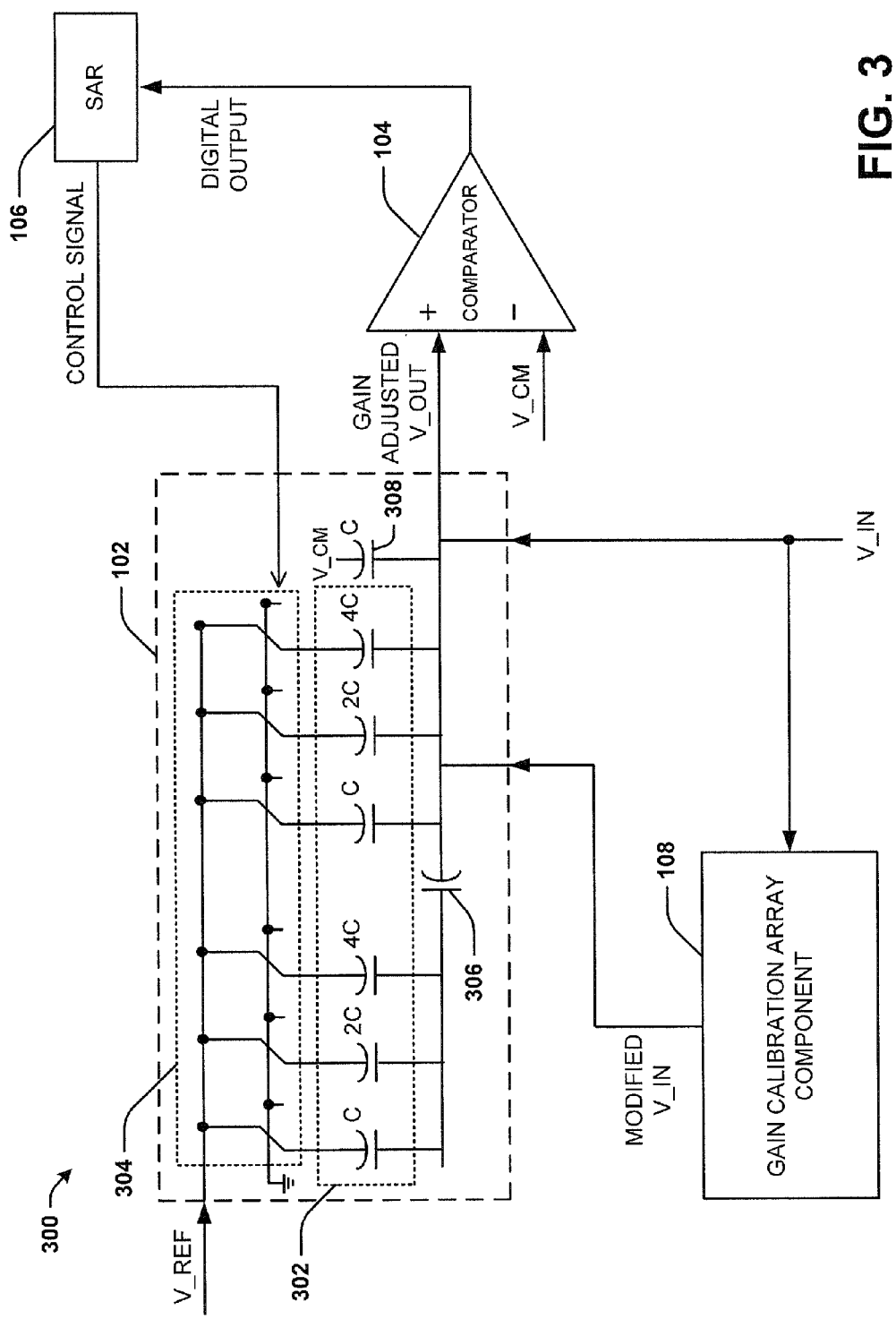
FIG. 3 is a diagram illustrating another example, non-limiting embodiment of a capacitor array component in accordance with various aspects described herein.

Referring now to FIG. 3, a block diagram illustrating an example, non-limiting embodiment of a system 300 in accordance with various aspects described herein is shown. System 300 includes the capacitor array component 102, the comparator 104, the SAR 106 and/or the gain calibration array component 108. The capacitor array component 102 can include a plurality of capacitors 302. For example, the plurality of capacitors 302 can be a plurality of binary-weighted capacitors (e.g., a plurality of switched capacitors). In another example, the plurality of capacitors 302 can be a plurality of thermometric weighted capacitors. The plurality of capacitors 302 can be configured to generate the gain adjusted output voltage. Additionally, the capacitor array component 102 can include a set of switches 304. The set of switches 304 can be controlled based on the control signal generated by the SAR 106. For example, each switch from the set of switches 304 can be switched to the reference voltage (e.g., V_REF) or ground based on the control signal generated by the SAR 106. In an implementation, the plurality of capacitors 302 and the set of switches 304 can correspond to the charge redistribution component 202 shown in FIG. 2. In the example shown in FIG. 3, the plurality of capacitors 302 includes a first set of capacitors and a second set of capacitors with capacitors corresponding to values C, 2C and 4C, where C corresponds to a capacitance value. However, it is to be appreciated that number of capacitors and/or capacitor values included in the plurality of capacitors 302 can be varied based on a particular implementation.

In an aspect, the capacitor array component 102 can also include a capacitor 306 (e.g., a bridge capacitor). The capacitor 306 can be configured to control a capacitor size (e.g., capacitance value) for each of the plurality of capacitors 302. For example, the capacitor 306 can scale down values of capacitors included in the plurality of capacitors 302 (e.g., to reduce effective weight of capacitors included in the plurality of capacitors 302). Additionally or alternatively, the capacitor array component 102 can also include a capacitor 308. The capacitor 308 can be a least significant bit (LSB) capacitor (e.g., a dummy LSB capacitor) associated with the plurality of capacitors 302.

Figure 4:
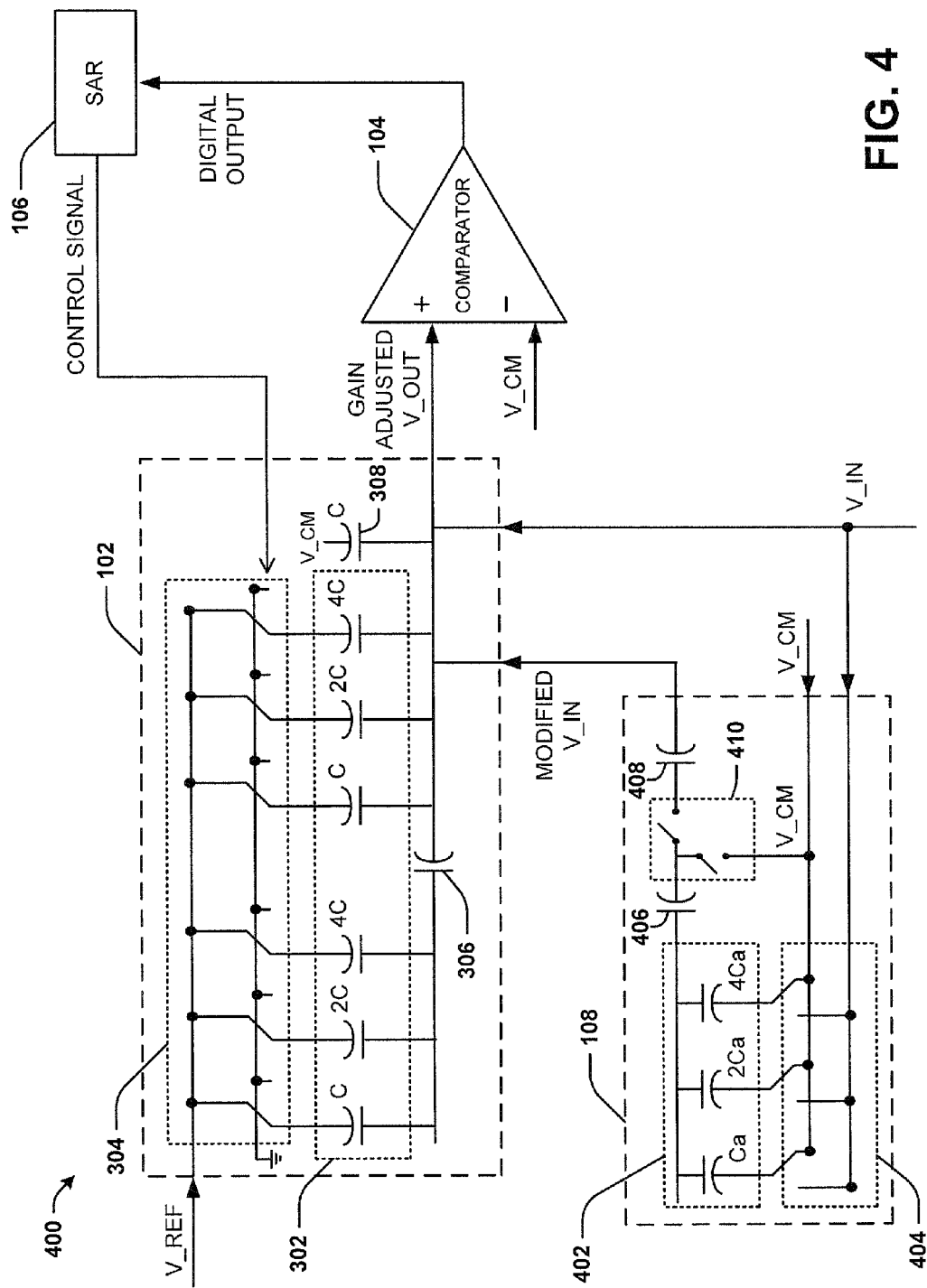
FIG. 4 is a diagram illustrating an example, non-limiting embodiment of a gain calibration component in accordance with various aspects described herein.

Referring now to FIG. 4, a block diagram illustrating an example, non-limiting embodiment of a system 400 in accordance with various aspects described herein is shown. System 400 includes the capacitor array component 102, the comparator 104, the SAR 106 and/or the gain calibration array component 108. The capacitor array component 102 can include the plurality of capacitors 302, the set of switches 304, the capacitor 306 and/or the capacitor 308. The gain calibration array component 108 can include at least a plurality of capacitors 402 and a set of switches 404. The plurality of capacitors 402 can be a plurality of gain calibration capacitors. In one example, the plurality of capacitors 402 can be a plurality binary-weighted capacitors (e.g., a plurality of switched capacitors). In another example, the plurality of capacitors 402 can be a plurality of thermometric weighted capacitors. The set of switches 404 can be configured to provide a node for each of the plurality of capacitors 402 with either the input voltage (e.g., V_IN) or the common mode voltage (e.g., V_CM). In an implementation, the set of switches 404 can be controlled by the control signal generated by the SAR 106. In the example shown in FIG. 4, the plurality of capacitors 402 includes capacitors corresponding to values Ca, 2Ca and 4Ca, where Ca corresponds to a capacitance value. However, it is to be appreciated that number of capacitors and/or capacitor values included in the plurality of capacitors 402 can be varied based on a particular implementation.

Additionally, the gain calibration array component 108 can include a capacitor 406, a capacitor 408 and/or a set of switches 410. The capacitor 406 and the capacitor 408 can be implemented as bridge capacitors or split capacitors. The capacitor 406 and the capacitor 408 can be configured to control a capacitor size (e.g., capacitance value) for each of the plurality of capacitors 402. For example, the capacitor 406 and the capacitor 408 can scale down values of capacitors included in the plurality of capacitors 402 (e.g., to reduce effective weight of capacitors included in the plurality of capacitors 402). The set of switches 410 can be configured to control an amount of charge that is provided to the capacitor array component 102 by the plurality of capacitors 402. For example, the set of switches 410 can control whether or not the capacitor array component 102 receives the modified input voltage generated by the plurality of capacitors 402.

In an aspect, the gain calibration array component 108 (e.g., the plurality of capacitors 402) can sample the input voltage (e.g., V_IN) using bottom-plate sampling of the plurality of capacitors 402, while the capacitor array component 102 (e.g., the plurality of capacitors 302) can sample the input voltage (e.g., V_IN) using top-plate sampling of the plurality of capacitors 302. In another aspect, the gain calibration array component 108 (e.g., the plurality of capacitors 402) can sample the input voltage (e.g., V_IN) using bottom-plate sampling of the plurality of capacitors 402, and the capacitor array component 102 (e.g., the plurality of capacitors 302) can sample the input voltage (e.g., V_IN) using bottom-plate sampling of the plurality of capacitors 302. The capacitor 406 and the capacitor 408 can be employed to transfer charge (e.g., the modified input voltage) from the gain calibration array component 108 (e.g., the plurality of capacitors 402) to the capacitor array component 102. Furthermore, the capacitor 406 and the capacitor 408 can attenuate an effective capacitance of the plurality of capacitors 402 and/or effects of signal-dependent charge injection into the capacitor array component 102. In one example, capacitors in the plurality of capacitors 402 can be selected based on a gain measurement.

Figure 5:
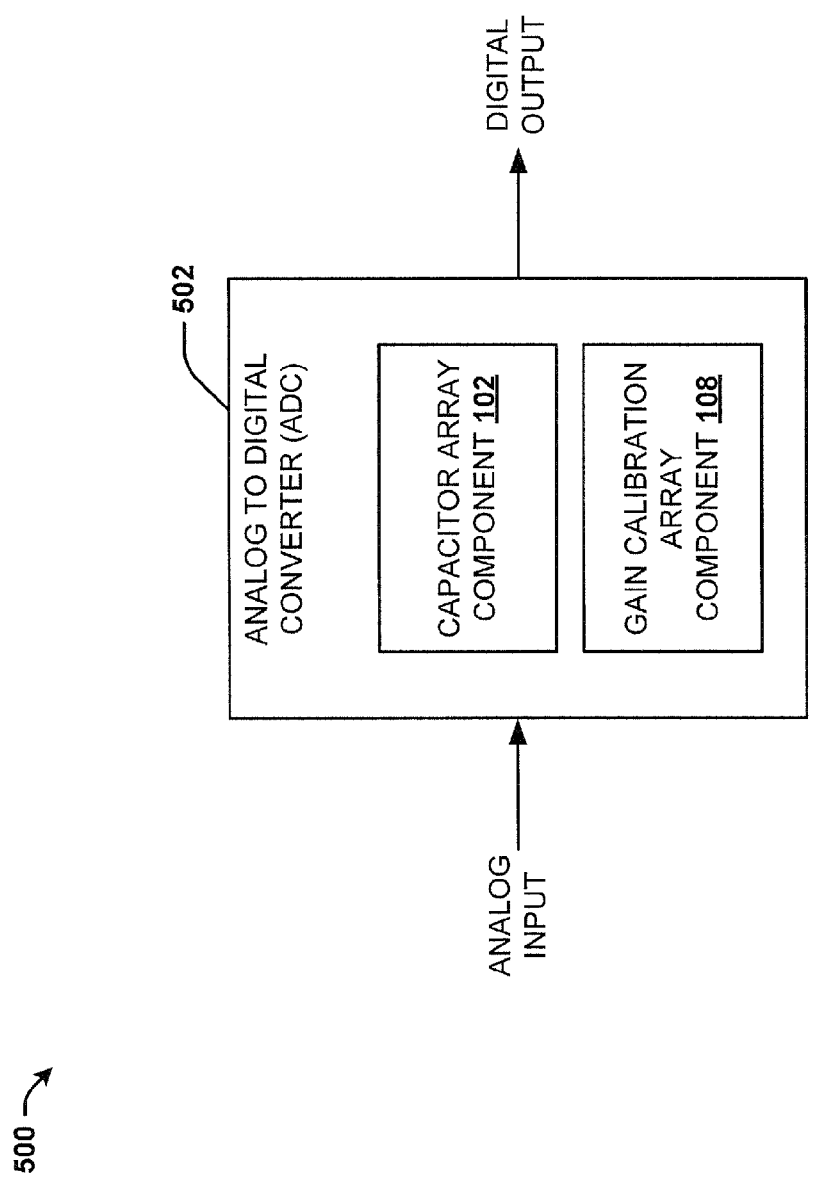
FIG. 5 is a block diagram illustrating an example, non-limiting embodiment of an analog to digital converter in accordance with various aspects described herein.

Referring now to FIG. 5, a block diagram illustrating an example, non-limiting embodiment of a system 500 in accordance with various aspects described herein is shown. System 500 includes an ADC 502. In one example, the ADC 502 can be an SAR ADC. The ADC 502 includes at least the capacitor array component 102 and the gain calibration array component 108. The ADC 502 can receive analog input (e.g., ANALOG INPUT shown in FIG. 5) and can generate digital output (e.g., DIGITAL OUTPUT shown in FIG. 5). The analog input can be an analog signal that corresponds to the input voltage (e.g., V_IN shown in FIGS. 1-4. The digital output can be a digital signal that corresponds to the digital output shown in FIGS. 1-4. The digital output can be a digital representation of the analog input. The ADC 502 can implement analog gain adjustment for the capacitor array component 102 via the gain calibration array component 108 (e.g., gain adjustment for the capacitor array component 102 in the analog domain). Accordingly, gain calibration associated with the ADC 502 can occur prior to generating the digital signal (e.g., gain calibration associated with the ADC 502 can occur in the analog domain).

Figure 6:
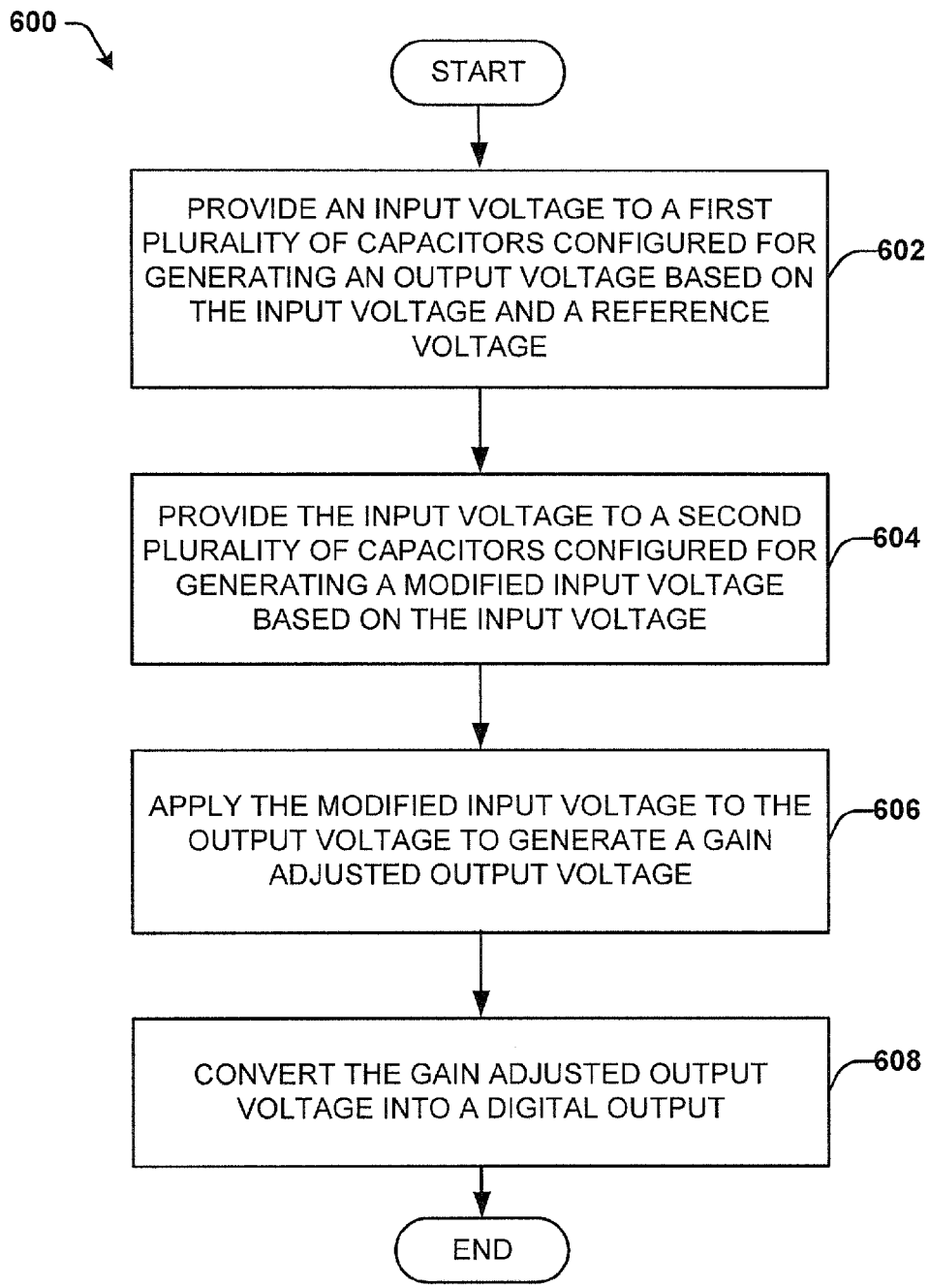
FIG. 6 illustrates a flow diagram of an example, non-limiting embodiment of a method for adjusting gain in accordance with various aspects described herein.
Figure 7:
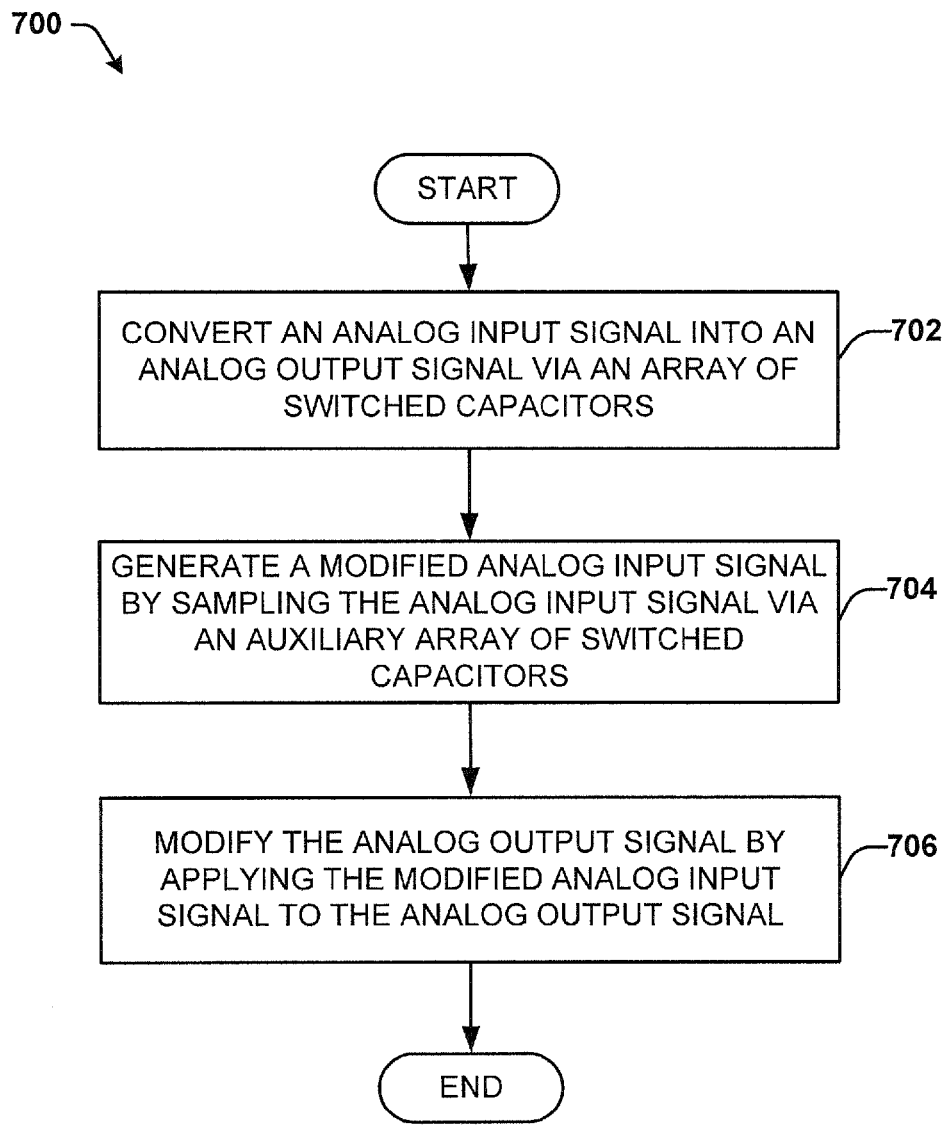
FIG. 7 illustrates a flow diagram of an example, non-limiting embodiment of a method for compensating for gain error in accordance with various aspects described herein.
Figure 8:
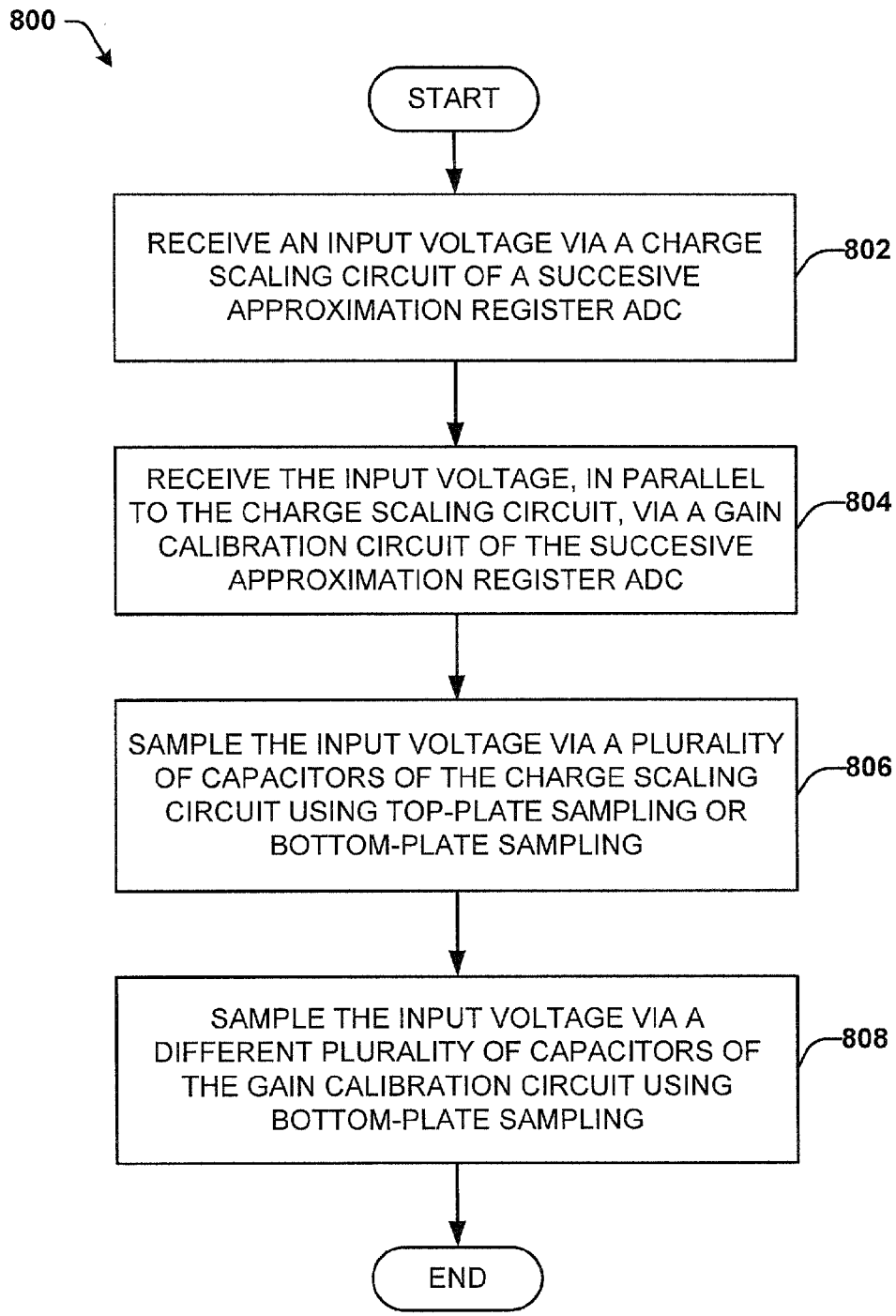
FIG. 8 illustrates a flow diagram of an example, non-limiting embodiment of a method for facilitating gain calibration in accordance with various aspects described herein.

In view of the example systems described above, methods that may be implemented in accordance with the described subject matter may be better appreciated with reference to the flow charts of FIGS. 6-8. While for purposes of simplicity of explanation, the methods are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described hereinafter.

Referring to FIG. 6, a flow diagram of an example, non-limiting embodiment of a method for adjusting gain is shown. Method 600 can begin at block 602, where an input voltage is provided to a first plurality of capacitors configured for generating an output voltage based on the input voltage and a reference voltage. The first plurality of capacitors can be a plurality of DAC sampling capacitors. For example, an input voltage (e.g., an analog input voltage) can be provided to a plurality of binary-weighted capacitors (e.g., a plurality of switched binary-weighted capacitors) or a plurality of thermometric weighted capacitors. The first plurality of capacitors (e.g., the plurality of binary-weighted capacitors or the plurality of thermometric weighted capacitors) can be included in a capacitor array component (e.g., a charge scaling circuit) of an ADC (e.g., an SAR ADC). In one example, the input voltage can be an SAR ADC input voltage.

At block 604, the input voltage is provided to a second plurality of capacitors configured for generating a modified input voltage based on the input voltage. The second plurality of capacitors can be a plurality of gain calibration capacitors. For example, the input voltage (e.g., the analog input voltage) can be provided to a different plurality of binary-weighted capacitors (e.g., a different plurality of switched binary-weighted capacitors) or a different plurality of thermometric weighted capacitors. The second plurality of capacitors (e.g., the different plurality of binary-weighted capacitors or the different plurality of thermometric weighted capacitors) can be included in a gain calibration array component (e.g., a gain calibration circuit) of the ADC (e.g., the SAR ADC). The modified input voltage can be an analog voltage.

At block 606, the modified input voltage is applied to the output voltage to generate a gain adjusted output voltage. For example, a portion of the input voltage (e.g., a certain percentage of the input voltage) can be applied to the output voltage to generate the gain adjusted output voltage. The gain adjusted output voltage can be an analog voltage.

At block 608, the gain adjusted output voltage is converted into a digital output. For example, the digital output can be a digital representation of the input voltage. In one example, the gain adjusted output voltage can be converted into the digital output via a comparator.

Referring to FIG. 7, a flow diagram of an example, non-limiting embodiment of a method for compensating for gain error is shown. Method 700 can begin at block 702, where an analog input signal is converted into an analog output signal via an array of switched capacitors. The array of switched capacitors can be an array of binary-weighted capacitors coupled to a set of switches associated with a reference signal. Alternatively, the array of switched capacitors can be an array of thermometric weighted capacitors coupled to a set of switches associated with a reference signal. In one example, the array of switched capacitors can be included in a capacitor array component (e.g., a charge scaling circuit) of an ADC (e.g., an SAR ADC).

At block 704, a modified analog input signal is generated by sampling the analog input signal via an auxiliary array of switched capacitors. The auxiliary array of switched capacitors can be a different array of binary-weighted capacitors coupled to a different set of switches associated with the analog input signal and a common mode signal. Alternatively, the auxiliary array of switched capacitors can be a different array of thermometric weighted capacitors coupled to a different set of switches associated with the analog input signal and a common mode signal. In one example, the array of switched capacitors can be included in a gain calibration array component (e.g., a gain calibration circuit) of the ADC (e.g., the SAR ADC).

At block 706, the analog output signal is modified by applying the modified analog input signal to the analog output signal. For example, the analog output signal can be modified to compensate for gain error associated with the array of switched capacitors. In an aspect, the modified analog input signal can be added to the analog output signal to generate a new analog output signal. The new analog output signal can be converted into a digital representation of the analog input signal.

Referring to FIG. 8, a flow diagram of an example, non-limiting embodiment of a method for facilitating gain calibration is shown. Method 800 can begin at block 802, where an input voltage is received via a charge scaling circuit of a successive approximation register ADC. For example, the input voltage can be an analog voltage signal.

At block 804, the input voltage is received, in parallel to the charge scaling circuit, via a gain calibration circuit of the successive approximation register ADC. For example, the gain calibration circuit can be an analog circuit that is different than (e.g., auxiliary to) the charge scaling circuit.

At block 806, the input voltage is sampled via a plurality of capacitors of the charge scaling circuit using top-plate sampling or bottom-plate sampling. For example, the charge scaling circuit can generate an output voltage by sampling the input voltage using top-plate sampling of the plurality of capacitors or bottom-plate sampling of the plurality of capacitors.

At block 808, the input voltage is sampled via a different plurality of capacitors of the gain calibration circuit using bottom-plate sampling. For example, the gain calibration circuit can generate a modified input voltage by sampling the input voltage using bottom-plate sampling of the different plurality of capacitors. In an aspect, the modified input voltage can be added to the output voltage generated by the charge scaling circuit to generate a modified output voltage (e.g., a gain adjusted output voltage). The modified output voltage can then be converted into a digital representation of the input voltage.

Reference throughout this specification to "one embodiment," "an embodiment," "an example," "a disclosed aspect," "an implementation," or "an aspect" means that a particular feature, structure, or characteristic described in connection with the embodiment or aspect is included in at least one embodiment or aspect of the present disclosure. Thus, the appearances of the phrase "in one embodiment," "in one aspect," "in an implementation," or "in an example," in various places throughout this specification are not necessarily all referring to the same embodiment. Furthermore, the particular features, structures, or characteristics may be combined in any suitable manner in various disclosed embodiments.

As utilized herein, terms "component," "system," "circuit," "register," "comparator," "architecture," and the like are intended to refer to a computer or electronic-related entity, either hardware, a combination of hardware and software, software (e.g., in execution), or firmware. For example, in certain implementations, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. In certain implementations, a component can include erasable programming (e.g., process instructions at least in part stored in erasable memory) or hard programming (e.g., process instructions burned into non-erasable memory at manufacture).

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An analog to digital converter system, comprising:
a capacitor array component comprising a plurality binary-weighted capacitors and configured for generating an output voltage received by a comparator based on an input voltage and a reference voltage; and
a gain calibration component configured for receiving the input voltage, generating, via a plurality of capacitors of the gain calibration component, a modified input voltage that corresponds to a portion of the input voltage, and applying the modified input voltage to the output voltage generated by the capacitor array component, the gain calibration component being configured for controlling transfer of the modified input voltage to the capacitor array component via a set of switches located between the plurality of capacitors and the capacitor array component.

2. The analog to digital converter system of claim 1, wherein the comparator is configured for generating a digital signal based on the output voltage.

3. The analog to digital converter system of claim 1, further comprising a successive approximation register configured for receiving a digital signal generated by the comparator based on the output voltage.

4. The analog to digital converter system of claim 3, wherein the successive approximation register is configured for generating a control signal that is received by the capacitor array component.

5. The analog to digital converter system of claim 1, wherein the plurality of capacitors are configured for generating the modified input voltage based on the input voltage.

6. The analog to digital converter system of claim 1, wherein the set of switches, located between the plurality of capacitors and the capacitor array component, is associated with the input voltage and a common mode voltage.

7. The analog to digital converter system of claim 1, wherein the plurality of capacitors are configured for sampling the input voltage using bottom-plate sampling and the plurality of binary-weighted capacitors are configured for sampling the input voltage using top-plate sampling.

8. The analog to digital converter system of claim 1, wherein the plurality of capacitors and the plurality of binary-weighted capacitors are configured for sampling the input voltage using bottom-plate sampling.

9. The analog to digital converter system of claim 1, wherein the gain calibration component is configured for transferring the modified input voltage to the capacitor array component via one or more bridge capacitors.

10. The analog to digital converter system of claim 1, wherein the input voltage and the modified input voltage are analog voltage signals.

11. A gain calibration method, comprising:
providing an input voltage to a first plurality of capacitors configured for generating an output voltage based on the input voltage and a reference voltage;
providing the input voltage to a second plurality of capacitors configured for generating a modified input voltage based on the input voltage;
transferring the modified input voltage to the first plurality of capacitors via a set of switches located between the second plurality of capacitors and the first plurality of capacitors;
applying the modified input voltage to the output voltage to generate a gain adjusted output voltage; and
converting the gain adjusted output voltage into a digital output.

12. The gain calibration method of claim 11, wherein the applying the modified input voltage to the output voltage comprises applying a portion of the input voltage to the output voltage.

13. The gain calibration method of claim 11, wherein the providing the input voltage to the first plurality of capacitors comprises providing the input voltage to a plurality of binary-weighted capacitors.

14. The gain calibration method of claim 11, wherein the providing the input voltage to the first plurality of capacitors comprises providing the input voltage to a charge scaling circuit of an analog to digital converter.

15. The gain calibration method of claim 11, wherein the providing the input voltage to the second plurality of capacitors comprises providing the input voltage to a plurality of binary-weighted capacitors.

16. The gain calibration method of claim 11, wherein the providing the input voltage to the second plurality of capacitors comprises providing the input voltage to a gain calibration circuit of an analog to digital converter.

17. A gain calibration method, comprising:
receiving an input voltage via a charge scaling circuit of an analog to digital converter (ADC);
receiving an input voltage, in parallel to the charge scaling circuit, via a gain calibration circuit of the ADC;
sampling the input voltage via a plurality of capacitors of the charge scaling circuit using top-plate sampling; and
sampling the input voltage via a different plurality of capacitors of the gain calibration circuit using bottom-plate sampling, comprising providing a modified input voltage to the charge scaling circuit via a set of switches located between the different plurality of capacitors and the charge scaling circuit.

18. The gain calibration method of claim 17, wherein the sampling the input voltage via the plurality of capacitors of the charge scaling circuit comprises sampling the input voltage via a plurality of binary-weighted capacitors.

19. The gain calibration method of claim 17, wherein the sampling the input voltage via the different plurality of capacitors of the gain calibration circuit comprises sampling the input voltage via a plurality of binary-weighted capacitors.

20. The gain calibration method of claim 17, wherein the sampling the input voltage via the different plurality of capacitors of the gain calibration circuit comprises sampling the input voltage via a plurality of thermometric weighted capacitors.

* * * * *